(12) United States Patent
Boss et al.

(10) Patent No.: US 11,385,296 B2
(45) Date of Patent: Jul. 12, 2022

(54) ESTIMATING A BATTERY STATE OF AN ELECTROCHEMICAL BATTERY (71) Applicant: NOVUM engineerING GmbH, Dresden (DE)

(72) Inventors: Valentin Boss, Dresden (DE); Sören Birth, Dresden (DE)

(73) Assignee: NOVUM ENGINEERING GMBH, Dresden (DE)

( * ) Notice: Subject to any disclaimer, the term of this patent is extended or adjusted under 35 U.S.C. 154(b) by 0 days.

(21) Appl. No.: 17/077,905

(22) Filed: Oct. 22, 2020

(65) Prior Publication Data

US 2021/0123981 A1 Apr. 29, 2021

(30) Foreign Application Priority Data

Oct. 23, 2019 (EP) .................................... 19 204 753

(51) Int. Cl.
*G01R 31/392* (2019.01)
*G01R 31/387* (2019.01)
*G01R 31/367* (2019.01)

(52) U.S. Cl.
CPC ......... *G01R 31/392* (2019.01); *G01R 31/367* (2019.01); *G01R 31/387* (2019.01)

(58) Field of Classification Search
None
See application file for complete search history.

(56) References Cited

U.S. PATENT DOCUMENTS

| 4,678,998 | A | 7/1987 | Muramatsu |
| 6,307,378 | B1 | 10/2001 | Kozlowski |
| 8,994,340 | B2 | 3/2015 | Matthe et al. |
| 2005/0048336 | A1 | 3/2005 | Takebe et al. |

(Continued)

FOREIGN PATENT DOCUMENTS

| DE | 112015005201 T5 | 7/2017 |
| DE | 112016002873 T5 | 3/2018 |

(Continued)

OTHER PUBLICATIONS

European Patent Office, Extended European Search Report and Opinion, European Patent Application 19204753.8, dated May 19, 2020, seven pages.

*Primary Examiner* — Jas A Sanghera
(74) *Attorney, Agent, or Firm* — Fenwick & West LLP (57) ABSTRACT

A computer-implemented method and a battery state estimating system for estimating a battery state of an electrochemical battery, including: weighting the electrical impedance measurements of a provided series of electrical impedance measurements according to a weighting function that is dependent on the index(s) of the series or on the measurement frequency, resulting in at least a series of consecutive elements of the series of measurements, when point-to-point connected in the complex plane of the electrical impedance in a sequence according to the index of the series of measurements, forming at least one loop in the complex plane; calculating a measure of the size of the at least one loop in the complex plane; determining an estimation of a battery state of the electrochemical battery based on the calculated measure of the size of the at least one loop in the complex plane; and outputting the estimation of the battery state.

13 Claims, 5 Drawing Sheets

(56) References Cited

U.S. PATENT DOCUMENTS

| | | | |
|---|---|---|---|
| 2011/0031048 | A1 | 2/2011 | Ohkura |
| 2013/0307487 | A1 | 11/2013 | Matthe et al. |
| 2014/0222358 | A1 | 8/2014 | Morita et al. |
| 2018/0222344 | A1* | 8/2018 | Oguma .................. B60L 58/12 |

FOREIGN PATENT DOCUMENTS

| | | |
|---|---|---|
| DE | 112016003789 T5 | 5/2018 |
| EP | 1129343 B1 | 6/2008 |
| EP | 1702219 B1 | 5/2012 |
| JP | 2003-249271 A | 9/2003 |
| JP | 4038788 B2 | 1/2008 |
| WO | WO 00/16083 A1 | 3/2000 |
| WO | WO 03/071617 A2 | 8/2003 |
| WO | WO 2005/059579 A1 | 6/2005 |
| WO | WO 2016/080111 A1 | 5/2016 |
| WO | WO 2016/208745 A1 | 12/2016 |
| WO | WO 2017/047192 A1 | 3/2017 |
| WO | WO 2017/110437 A1 | 6/2017 |

* cited by examiner

ESTIMATING A BATTERY STATE OF AN ELECTROCHEMICAL BATTERY

CROSS-REFERENCE TO RELATED APPLICATION

This application claims priority to European Patent Application No. 19 204 753.8, filed on Oct. 23, 2019, which is incorporated by reference herein in its entirety.

BACKGROUND

The invention relates to a computer-implemented method of estimating a battery state of an electrochemical battery. Furthermore, the invention relates to a battery state estimating system for estimating a battery state of an electrochemical battery.

For example, the computer may be a microcontroller. For example, the computer or microcontroller may include a processing unit, a memory, and input/output ports.

WO 2005/059579 A1 and EP 1702219 B1 describe an apparatus and a method for estimating a state of charge of a battery by using a neural network. The apparatus includes a sensing section for detecting current, voltage and a temperature from a battery cell and a neural network performing a neural network algorithm and a learning algorithm based on data of the current, voltage and temperature transmitted thereto from the sensing section and present time data.

U.S. Pat. No. 4,678,998 A describes a battery condition monitor and a monitoring method. The monitor includes a computer for computing internal impedances of the storage battery from different frequency components of voltage and amperage signals from the battery, a memory for storing predetermined relationships between the internal impedance, remaining capacity and remaining service life of the storage battery for each of the frequencies and a device for determining the remaining capacity and remaining service life values for the storage battery in agreement at both or all frequency values.

JP 2003-249271 A and JP 4038788 B2 describe the determining of a deterioration state and a residual capacity of a battery in real time. In an example, as an operation parameter of the battery under operation, a measurement unit can measure and sample periodically the voltage of the battery, the current, the internal impedance, and the temperature. The internal impedance of the battery is measured by adding an AC signal of 1 kHz and 100 mA to the battery. A first neural network can decide on a deterioration state as "normal", "caution", and "degradation", based on the operation parameter of the battery from the measurement unit, and a second neural network can decide on the residual capacity based on the operation parameter of the battery and the deterioration state from the first neural network.

U.S. Pat. No. 6,307,378 B1 describes a method and an apparatus for measurement of electrochemical cell and battery impedances.

WO 03/071617 A2 describes a method for determining a condition parameter of an electrochemical cell, such as in a battery. In an example, measurement signals such as terminal voltages, cell voltages, load current, charging current, ambient temperature, battery surface temperature, terminal temperature, internal battery temperature, and impedance signals are passed to a feature extraction processing algorithm, which generates a feature vector and a feature flag. Data from the feature vector is passed to a neural network ISOC predictor for initial battery capacity state of charge estimation, and a neural network CSOC predictor for continuous prediction of SOC during operation. In another example, the information contained in a feature vector is used by a neural network SOH classifier, a linear/statistical SOH classifier, and a fuzzy logic SOH classifier for state of health classification.

WO 2016/208745 A1 and its translation DE 112016002873 T5 describe a method of recognizing the state of charge or depth of discharge of a battery. The method includes determining the complex impedance between the positive and negative electrodes of a battery with respect to a plurality of frequencies.

WO 2017/110437 A1 and its translation DE 11 2016 003 789 T5 describe an estimation device that estimates the residual capacity of a lithium ion battery.

WO 2016/080111 A1 and its translation DE 11 2015 005 201 T5 describe an estimation device for estimating a remaining stored power amount of a storage battery.

US 2013/0307487 A1 and U.S. Pat. No. 8,994,340 B2 describe a method and a system for determining the temperature of cells in a battery pack, without using temperature sensors, by measuring the impedance of the cells and using the impedance to determine the temperature.

WO 00/16083 and EP 1129343 B1 describe a device that measures real and imaginary parts of complex immittance of a cell or battery at n discrete frequencies. The device determines cell/battery properties by evaluating components of an equivalent circuit model.

Conventional methods or devices that determine battery properties using a model of the battery or using known values have to be specifically adapted for a particular battery. For example, usually, different electrical impedances are measured for different batteries of the same battery type. Moreover, different electrical impedances are measured for different battery types. For example, different electrical impedances are measured for a lithium iron phosphate ($LiFePO_4$) battery cell and a lithium cobalt oxide ($LiCoO_2$) battery cell, due to different chemical properties of the cell. Furthermore, different electrical impedances may be measured depending on additives of the electrolytes.

In the prior art, determining the remaining capacity and the remaining service life of a storage battery from electrical impedances is only possible for a specific storage battery, for which storage battery the relationships between the electrical impedance and the remaining capacity and remaining service life have been determined beforehand and stored for each of different frequencies.

SUMMARY OF THE INVENTION

It is an object of the invention to provide a novel method of estimating a battery state of an electrochemical battery based on electrical impedance measurements. It is desirable that the method allows for a simple implementation on a computer, such as a microcontroller, while making use of information contained in a curve progression in the complex plane of electrical impedance of a series of electrical impedance measurement.

The invention is indicated in the independent claims. Further embodiments are indicated in the dependent claims.

According to one aspect of the invention, there is provided a computer-implemented method of estimating a battery state of an electrochemical battery, the method comprising: (i) providing a series of electrical impedance measurements of an electrochemical battery, each electrical impedance measurement being measured at a respective measurement frequency, the series being ordered according to the respective measurement frequencies, (ii) optionally, translating and/or scaling, in the complex plane of the electrical impedance, the series of electrical impedance measurements, (iii) weighting the electrical impedance measurements according to a weighting function that is dependent on the index of the series or on the measurement frequency, resulting in at least a series of consecutive elements of the series of measurements, when point-to-point connected in the complex plane of the electrical impedance in a sequence according to the index of the series of measurements, forming at least one loop in the complex plane, calculating a measure of the size of the at least one loop in the complex plane, (iv) determining an estimation of a battery state of the electrochemical battery based on the calculated measure of the size of the at least one loop in the complex plane, and (v) outputting the estimation of the battery state.

In case of the method including the translating and/or scaling, the step of weighting, the step of translating, and the step of scaling may be performed in any order. In particular, the step of weighting may be performed before or after the translating and/or scaling. That is, the step of weighting may be performed on the provided series of electrical impedance measurements, or on the translated and/or scaled series of electrical impedance measurements.

Preferably, the weighting function is a continuous function.

Preferably, the weighting function is a real function. That is, the weighting function assumes real numbers as its output values. In one or more embodiments, the weighting function may be a real monotonic function. However, the weighting function may also be a complex function, assuming complex numbers as its outputs.

Weighting the electrical impedance measurements comprises weighting the real part and weighting the imaginary part of the electrical impedance measurements according to the weighting function.

Herein, the term "complex plane", unless specified otherwise, is to be understood as the complex plane of electrical impedance. For example, the term "zero-crossing in the complex plane of the imaginary part of electrical impedance" refers to a position in the complex plane of electrical impedance, at which position the imaginary part of electrical impedance crosses a value of zero.

For example, more than one loop may be formed, and the method may comprise calculating respective measures of the respective sizes of the respective loops in the complex plane, and determining an estimation of a battery state of the electrochemical battery based on the calculated measures of the sizes of the respective loops in the complex plane. That is, for each loop, a measure of its size is calculated.

Or, for example, more than one loop may be formed, and the method may comprise calculating a measure of the sizes of the loops in the complex plane, For example, a measure of the sizes may be calculated from (for example, by addition) calculated measures of the sizes the respective individual loops.

Preferably, the loop is an at least partially closed loop, more preferably, a closed loop. A partially closed loop is understood as having, in the complex plane, a width (an inside opening width) that decreases towards an open end of the loop in a direction perpendicular to the width of the open end.

The measure of the size of the loop may include one of: the area in the complex plane enclosed by the loop; an extension of the loop, such as a width in the direction of the real part, or a height in the direction of the imaginary part, or a length in a direction of maximum extension of the loop (a lengthwise extension). Other measures of the size of a loop may be implemented, as well.

Due to the weighting function resulting in a series of consecutive elements of the series of measurements forming at least one loop in the complex plane, the weighting function emphasizes features of the curve progression of the electrical impedance in the complex plane. For example, the size of a loop (in particular, for example, the area in the complex plane enclosed by the loop) may relate the electrical impedance of one part of the series of electrical impedance measurements to the electrical impedance of another part of the series of electrical impedance measurements (which parts correspond to opposite sides or paths of the loop). Or, for example, the size of a loop (in particular, an extension of the loop) may depend on the progression of the real part and/or imaginary part of electrical impedance over the course of the measurement frequency (that is, its progression with increasing measurement frequency) or over the course of the index of the series of electrical impedance measurements (that is, with increasing index.

Therefore, the calculated measure provides a useful indication of a battery state of the electrochemical battery that may be directly calculated from a series of electrical impedance measurements, that is, calculated according to a calculation rule or calculation algorithm.

For example, the calculated measure may be determined as the estimation of a battery state.

For example, the estimation of a battery state may be determined according to an arithmetical relation of the battery state and the calculated measure.

In one or more embodiments, the estimation of the battery state may be determined based on the calculated measure using a look-up table and, optionally, interpolation.

The look-up-table may represent a correlation or, when interpolated, an arithmetical relation, between the at least one calculated measure of the size of the at least one loop and the battery state of the electrochemical battery.

For a particular kind of battery state, such as, for example, the state of health of a battery, such correlation (that is, the entries of the look-up-table) may be determined beforehand from test measurements of batteries of different states of health (that is, different values of the particular battery state), including determining the state of health in a conventional manner using battery test equipment. For example, batteries of a same kind of battery may be used that have undergone different use cycles or use scenarios.

In a similar manner, for example, parameters of an arithmetical relation of the battery state and the calculated measure may be determined beforehand.

The electrical impedance may also be termed a complex electrical impedance and may be a complex number and may be provided being expressed in a unit of electrical resistance, for example, ohm.

For example, each electrical impedance measurement of the provided series of electrical impedance measurements may be or include a complex number that defines a real part and an imaginary part of the respective electrical impedance. The electrical impedance may also be represented in polar form, defining a magnitude (or amplitude) and an angle (or phase).

For example, the electrical impedance measurements of the provided series of electrical impedance measurements may be in the form of respective complex representations (complex numbers). Or, for example, the electrical impedance measurements may each be in the form of amplitude and phase, and the step of providing may comprise converting the electrical impedance measurements into electrical impedance measurements in the form of respective complex representations of the electrical impedance measurements. A "complex representation" of an electrical impedance measurement comprises a complex number. For example, the complex representation of an electrical impedance measurement may be a complex number.

Herein, the term "battery" is to be understood as including a battery cell. The battery may include one or more battery cells. In particular, the term "battery" includes a battery cell as well as a battery composed of multiple battery cells.

Specifically, the electrochemical battery is understood as defining a device consisting of one or more electrochemical cells with external electrical connections. For example, the battery may include two external electrical connections for drawing power from the one or more electrochemical cells and, in case of a rechargeable electrochemical battery, for (re-)charging the one or more electrochemical cells.

Herein, the terms "absolute value" and "magnitude" are used interchangeably. For a real number (such as a real part or an imaginary part of a complex number), the term "absolute value" is understood as the non-negative value of the real number without regard to its sign. For a complex number x+iy, the term "absolute value" or "magnitude" is understood as the square root of $x^2+y^2$.

For example, the respective measurement frequency may be a frequency of a signal input to the electrochemical battery. For example, the signal may be a sinusoidal signal.

Preferably, each electrical impedance of the series of electrical impedance measurements to be weighted comprises a complex number that defines a real part and an imaginary part of a respective electrical impedance.

Preferably, the electrochemical battery is a rechargeable electrochemical battery.

Preferably, the series of electrical impedance measurements are provided in the form of a digital signal.

Preferably, the series of electrical impedance measurements of the electrochemical battery are provided in a digitally represented form.

The series of electrical impedance measurements may be received from an electrical impedance measuring unit or electrical impedance measuring means, for example.

Providing the series of electrical impedance measurements may comprise receiving the electrical impedance measurements of the series one after another.

The series of electrical impedance measurements may be communicated to a battery state estimating system comprising means for carrying out the steps of the method. The system may be configured for providing (including receiving) the communicated electrical impedance measurements.

In one or more embodiments, the measurement frequencies are assumed to be logarithmically equidistantly spaced. Preferably, the measurement frequencies are logarithmically equidistantly spaced over at least four decades of the measurement frequency range (the frequency range of the measurement frequencies), more preferably over at least five decades of the measurement frequency range.

Preferably, the measurement frequencies include a measurement frequency in the range of 0.1 to 1.0 Hz.

Preferably, the measurement frequencies include a measurement frequency in the range of 1 kHz to 10 kHz.

Preferably, the measurement frequencies include at least 4 (four) measurement frequencies per decade of the measurement frequency range, more preferably at least five measurement frequencies per decade of the measurement frequency range.

The step of providing the series of electrical impedance measurements may comprise receiving a plurality of electrical impedance measurements, each electrical impedance measurement being measured at a respective measurement frequency, and:

arranging the plurality of electrical impedance measurements according to the associated measurement frequencies to provide the series of electrical impedance measurements, or providing the plurality of the electrical impedance measurements as the series of electrical impedance measurements.

For example, the arranged plurality of electrical impedance measurements, optionally including the respective measurement frequencies, may be provided as the series of electrical impedance measurements.

The plurality of electrical impedance measurements, or the series of electrical impedance measurements may be received in the form of an electrical impedance spectrum.

In the series of electrical impedance measurements, for example, the electrical impedance measurements may include the respective measurement frequencies. For example, each electrical impedance measurement may include the measured value of the electrical impedance and the measurement frequency. However, the electrical impedance measurements may as well be in the form of respective electrical impedances, represented as respective complex numbers, or each represented as an amplitude and phase.

The battery state may include at least one of a state of charge (SoC) of the electrochemical battery, a state of health (SoH) of the electrochemical battery, a state of function (SoF) of the electrochemical battery, a capacity of the electrochemical battery, and a temperature of the electrochemical battery.

For example, the estimation of a battery state may be transmitted or communicated or output to an output unit for outputting the estimation of a battery state, and/or for outputting a visual signal indicating the estimation of a battery state. The visual signal may be displayed.

In one or more embodiments, the weighting function increases with increasing measurement frequencies.

Since for a large and relevant part of an electrical impedance spectrum of an electrochemical battery, the real part of the electrical impedance decreases with increasing measurement frequency, the effect on the real part of electrical impedance of a weighting function that increases with increasing measurement frequencies is opposed to the effect of decreasing real part of measured impedance with increasing measurement frequency. Thus, the weighting function is particularly suitable for "flipping over" some part of the series of electrical impedance measurements, thereby generating a loop in the complex plane that has a distinct extension in the direction of increasing real part.

In one or more embodiments, the weighting function increases with increasing measurement frequencies from negative values to positive values.

For example, the weighting function increases with increasing measurement frequencies and assumes a value of zero at a point or first position (corresponding to an index of the series or to a measurement frequency) that is distant from a position that corresponds to a zero-crossing of the imaginary part of electrical impedance of the series of measurements in the complex plane. Thereby, a closed loop is achieved that assumes the value of zero real part and zero imaginary part at the weighted position distant from the zero-crossing, and also at the weighted position of the zero-crossing. In other words, the part of the series of measurements that is between the first position and the position of the zero-crossing will form the closed loop, when connecting the elements of the series point-to-point.

For example, at a point corresponding to a measurement frequency of 1 Hz, the weighting function may be 0 (zero). This point is expected to be distant from a measurement frequency at which a zero-crossing of the imaginary part of electrical impedance occurs.

In one or more embodiments, the weighting function corresponds to a logarithm function of the measurement frequency.

For example, the weighting function may correspond to the logarithm to the base 10 of the measurement frequency.

It has been found that a weighting function that corresponds to a logarithm function of the measurement frequency is particularly well adapted to the expected course of the electrical impedance dependent on the measurement frequency.

Moreover, when the measurement frequencies of the provided series of electrical impedance measurements are logarithmically equidistantly spaced, a weighting function that corresponds to a logarithm function of the measurement frequency may be easily implemented as a linear function of the index of the series of measurements (that is, a weighting function that linearly increases over the index of the measurements). Thus, the calculation effort may be reduced.

In one or more embodiments, calculating a measure of the size of the at least one loop in the complex plane comprises calculating an area that is enclosed by the at least one loop in the complex plane.

For example, the measure of the size of the at least one loop in the complex plan may be calculated based on the calculated area. Or, the area may be calculated as the measure of the size of the at least one loop.

In one or more embodiments, calculating a measure of the size of the at least one loop in the complex plane comprises calculating a square root of an area that is enclosed by the at least one loop in the complex plane.

Preferably, the square root of the area is calculated as the measure of the size of the at least one loop in the complex plane.

Alternatively, the measure of the size of the at least one loop in the complex plan may be calculated based on the calculated square root of the area.

However, other linear or non-linear relations may be implemented for calculating the measure of the size of a loop from the area that is enclosed by the loop, or, for example, from an extension of the loop, etc.

In one or more embodiments, an estimation of a state of health of the electrochemical battery is determined based on the calculated measure of the size of the at least one loop in the complex plane.

Preferably, calculating a measure of the size of the at least one loop in the complex plane comprises calculating a square root of an area that is enclosed by the at least one loop in the complex plane, wherein an estimation of a state of health of the electrochemical battery is determined based on the calculated measure of the size of the at least one loop in the complex plane.

An estimation of the state of health is of high importance with respect to a reliability of a device.

It has been found that the square root of the area that is enclosed by a loop in the complex plane is particularly well suitable as an indication of the state of health of a rechargeable electrochemical battery.

In one or more embodiments, the method comprises: (i) identifying at least three subseries within the provided series of electrical impedance measurements, a first subseries of the three subseries being associated with a battery behavior of the electrochemical battery in which the electrical impedance is dominated by diffusion processes, a second subseries of the three subseries being associated with a battery behavior of the electrochemical battery in which the electrical impedance is dominated by charge transfer processes at the electrodes of the battery, a third subseries of the three subseries being separated from the second subseries at a position that corresponds to a zero-crossing in the complex plane of the imaginary part of electrical impedance, (ii) translating the respective electrical impedance measurements corresponding to subtracting an ohmic alternating current (AC) resistance value from the real part of electrical impedance, wherein the ohmic alternating current resistance value is determined according to a real part of electrical impedance at the zero-crossing in the complex plane of the imaginary part of electrical impedance which zero-crossing in the complex plane corresponds to the position at which the third subseries of the three subseries is separated from the second subseries; and (iii) scaling the respective translated electrical impedance measurements, corresponding to scaling the real part and the imaginary part of electrical impedance by respective scaling factors, the absolute values of which are determined based on the absolute values of the real part and the imaginary part, respectively, of an electrical impedance that corresponds to a transition between the translated first subseries of the series of electrical impedance measurements and the translated second subseries of the series of electrical impedance measurements.

Thus, the method may comprise identifying three subseries within the provided series of electrical impedance measurements. That is, the three subseries may be determined.

The zero-crossing may be a zero-crossing over the course of the index of measurements (a value of zero is crossed with increasing index) or over the course of the measurement frequency (a value of zero is crossed with increasing measurement frequency).

Herein, the signs of the real part and imaginary part of the electrical impedance are defined according to the battery impedance or internal resistance of the battery being regarded as an electric load, or energy sink. Therefore, at frequencies lower than at the zero-crossing in the complex plane of the imaginary part of electrical impedance, the imaginary part of the electrical impedance is negative, whereas at frequencies higher than at the zero-crossing, the imaginary part of the electrical impedance is positive.

For example, in case the weighting function is a monotonically increasing real function, the weighting function may assume a lowest value at a measurement frequency (or corresponding index of the series of measurements) which measurement frequency is lower than the frequency at which there is a zero-crossing in the complex plane of the imaginary part of electrical impedance. Then, after translating the series of measurements, the product of said lowest value and of the real part of the electrical impedance at the corresponding measurement frequency (in other words, the real part of the weighted electrical impedance at the corresponding measurement frequency) is smaller than zero, due to the weighting function. And, at the zero-crossing, the real part of the weighted electrical impedance is zero, due to the translating. Consequently, between the two mentioned frequencies, that is, between the measurement frequency that corresponds to the lowest value of the weighting function and the frequency at which there is the zero-crossing, there are weighted electrical impedance measurements having real parts that are larger than zero and forming a loop in the complex plane; the loop beginning and ending at zero real part. However, other real or complex weighting functions may be applied, as well.

The battery behavior of a particular battery may be dominated by diffusion processes and charge transfer processes at frequencies, which frequencies are highly dependent on the individual battery and, in particular, on a geometry and size of the battery, number of battery cells, circuitry connecting the battery cells in parallel and/or serially, etc. Due to the translating and scaling steps, the provided electrical impedance measurements stemming from a particular battery are brought into a normalized shape with respect to said processes. Thus, electrical impedance measurements from even such different configurations including serially connected battery cells and/or battery cells connected in parallel may be brought into a form, in which the differences in the electrical impedances that result from the different configurations are suppressed; thus, the electrical impedance measurements are made comparable, and an automated evaluation of a battery state by is facilitated.

Moreover, due to the translating and scaling steps, it can be assured that in the series of electrical impedance measurements to be weighted, the shape of the curve progression in the complex plane of the electrical impedance over the course of the measurement frequency (that is, with increasing measurements frequency) is emphasized relative to the specific values of the real part and imaginary part of the electrical impedance measurements. That is, the curve progression is relatively more pronounced, whereas the absolute values are relatively suppressed. Thereby, a battery state may be evaluated for different configurations and/or types of electrochemical batteries based on overall features of the progression of the electrical impedance with, for example, increasing measurement frequency, while avoiding or minimizing a bias due to differences in absolute values of the real part or imaginary part of the electrical impedance.

Whereas the ohmic AC resistance value $R_0$ of the impedance at the point of zero imaginary part has been suggested as an indicator for the deterioration of a rechargeable battery, this holds only for a specific battery; for different batteries, however, different values of $R_0$ occur that are an attribute of the different batteries rather than being an indicator for the deterioration. In contrast, the translated and scaled series represents the characteristic features of the electrical impedance spectrum (that is, the series of measurements) as features in relation to the transition. Thus, information from the spectrum is made available for estimating a battery state, in which inherent differences between different batteries are suppressed, while exhibiting those features that are characteristic for a battery state.

Preferably, the first, second and third subseries are consecutively arranged within the series of electrical impedance measurements.

For example, the position at which the third subseries of the three subseries is separated from the second subseries may be a position in the complex plane. For example, the position may be the position of the zero-crossing of the imaginary part of electrical impedance.

The first subseries is associated with a battery behavior of the electrochemical battery in which the electrical impedance is dominated by diffusion processes. That is, the first subseries is associated with a frequency response behavior of the electrochemical battery wherein the electrical impedance is dominated by diffusion processes, for the respective measurement frequencies of the first subseries. This is expected for first measurement frequencies, which are relatively low frequencies.

The second subseries is associated with a battery behavior of the electrochemical battery in which the electrical impedance is dominated by charge transfer processes at the electrodes of the battery. That is, the second subseries is associated with a frequency response behavior of the electrochemical battery wherein the electrical impedance is dominated by charge transfer processes at the electrodes of the battery, for the respective measurement frequencies of the second subseries. This is expected for second measurement frequencies, which are intermediate frequencies between the first measurement frequencies and third measurement frequencies of the third subseries.

The third subseries is separated from the second subseries at a position that corresponds to a zero-crossing in the complex plane of the imaginary part of electrical impedance. For example, the third subseries may be associated with a battery behavior of the electrochemical battery in which the electrical impedance is mainly an imaginary reactive impedance; for example, in the third subseries, the electrical impedance may have a positive imaginary part; for example, the electrical impedance may be dominated by ohmic and/or inductive characteristics of a cell geometry and of conductors/connectors of the battery. This is expected for third measurement frequencies, which are relatively high frequencies.

For example, the zero-crossing may be a zero-crossing of the imaginary part of an interpolation of the series of electrical impedance measurements. That is, for example, consecutive measurements of the series of measurements may be determined that show a changing of the sign (positive/negative) of the imaginary part of electrical impedance, the series of electrical impedance measurements may be interpolated in a region including these measurements (for example, by linear interpolation, spline interpolation, or polynomial interpolation), and a position of a zero-crossing of the imaginary part of the interpolation of the series may be determined as the position separating the second and third subseries.

For example, the method may comprise identifying a transition between a first subseries of the series of electrical impedance measurements, which first subseries is associated with a battery behavior of the electrochemical battery in which the electrical impedance is dominated by diffusion processes, and a second subseries of the series of electrical impedance measurements, which second subseries is associated with a battery behavior of the electrochemical battery in which the electrical impedance is dominated by charge transfer processes at the electrodes of the battery, and the first subseries and the second subseries may be identified based on the identified transition.

For the first and second subseries, the real part of the series of electrical impedance measurements is expected to decrease with increasing measurement frequencies. However, the imaginary part of the series of electrical impedance measurements is expected to show pronounced features, which are different for the first and second subseries.

The information on decreasing or increasing measurement frequencies is available due to the provided series of electrical impedance measurements being ordered according to the measurement frequencies; the greatest values of the positive real part of electrical impedance are expected to be measured at the lowest measurement frequencies.

Hereinafter, the terms "local relative maximum" or "local relative minimum" may refer to a local relative extremum over the course of the series of measurements (that is, within a number of consecutive elements of the series of measurements), or to a local relative extremum in the curve progression (curve shape) of the complex impedance in the complex plane. These definitions may be used interchangeable, because the real part of the series of electrical impedance measurements is expected to decrease with increasing measurement frequencies in the first and second subseries towards the zero-crossing of the imaginary part. A local relative extremum of the imaginary part in the curve progression (curve shape) of the complex impedance in the complex plane corresponds to a local relative extremum of the imaginary part over the course of the real part of the series of measurements (that is, a relative extremum of the imaginary part within a number of consecutive elements of the series of measurements). Optionally, the local relative maximum or minimum may be a local relative maximum or minimum when smoothing and/or interpolating the series of electrical impedance measurements. For example, a moving average may be used for smoothing.

Likewise, the terms "increasing towards" or "decreasing towards", unless specified otherwise, may refer to an increasing/decreasing over the course of the series of measurements (that is, with increasing or decreasing index of the series), or may refer, at least for the first and second subseries, to an increasing/decreasing over the course of the real part of the series of measurements (that is, with increasing or decreasing real part of the series). The direction of increasing/decreasing is defined by the increasing/decreasing being "towards" some point, element, or feature of the series.

For example, the second subseries of the three subseries may be separated from the first subseries at a transition, the transition forming a local relative maximum of the imaginary part of the series of electrical impedance measurements. For example, the transition may form a local relative maximum of the imaginary part of an interpolation of the series of electrical impedance measurements. The transition may be determined by interpolation, for example, using spline interpolation or polynomial interpolation. That is, for example, the local relative maximum may be determined, the series of electrical impedance measurements may be interpolated in a region around the local relative maximum, and a new local relative maximum of the interpolation of the series may be determined as the transition between the first and second subseries.

The local relative maximum of the imaginary part may be negative, that is, less than zero. For example, the local relative maximum may be a local minimum of the absolute value of the negative imaginary part of the series of electrical impedance measurements. That is, in a range including the transition, the electrical impedance measurements may have a negative imaginary part, respectively.

In case the identified step has a negative result in that at least one of the first and second subseries cannot be identified, a deterioration signal is generated, and the identifying step and the method are interrupted. This could be the case, for example, due to an unexpected curve progression of the provided series of electrical impedance measurements in the complex plane, which could, for example, occur in case of a deterioration of the electrochemical battery.

The absolute values of the scaling factors are determined based on the absolute values of the real part and the imaginary part, respectively, of an electrical impedance that corresponds to the transition between the translated first subseries and the translated second subseries. For example, the absolute values of the scaling factors may be proportional to the absolute values of the real part and the imaginary part, respectively, of an electrical impedance that corresponds to the transition.

For example, the absolute values of the scaling factors may correspond to the absolute values of the real part and the imaginary part, respectively, of an electrical impedance that corresponds to the transition. Preferably, in the series of electrical impedance measurements to be weighted, the real parts of the electrical impedance measurements of the second subseries are in a range from 0.0 to 1.0, due to the translating and scaling operations. Moreover, preferably, the transition between the first subseries and the second subseries is at a complex impedance having an imaginary part of −1.0 and having a real part of 1.0. Consequently, the real parts of the electrical impedance measurements of the first subseries of the translated and scaled series of electrical impedance measurements are in the range of greater than or equal to 1.0. And, the imaginary parts of the electrical impedance measurements of the third subseries, if applicable, are in the range of being greater than or equal to 0.0.

The features of the curve progression of the provided series of electrical impedance measurements in the complex plane are preserved by the translating and scaling steps.

In a simple implementation of one or more embodiments, the transition between the translated first subseries of the series of electrical impedance measurements and the translated second subseries of the series of electrical impedance measurements may be determined (that is, assumed) to be at a position corresponding to a measurement frequency of a predetermined value of, for example, 1.0 Hz. This position is to be understood as a position in the complex plane of electrical impedance.

In one or more embodiments, the step of identifying may comprise determining a local relative maximum of the imaginary part of the series of electrical impedance measurements, the local relative maximum being separated by other elements of the series of electrical impedance measurements from a zero-crossing in the complex plane of the imaginary part of electrical impedance of the series of electrical impedance measurements, wherein optionally the local relative maximum is a local relative maximum when smoothing and/or interpolating the series of electrical impedance measurements. In particular, the local relative maximum may be negative. In particular, the position of the local relative maximum may be determined as the transition between the translated first subseries of the series of electrical impedance measurements and the translated second subseries of the series of electrical impedance measurements.

Figure 3:
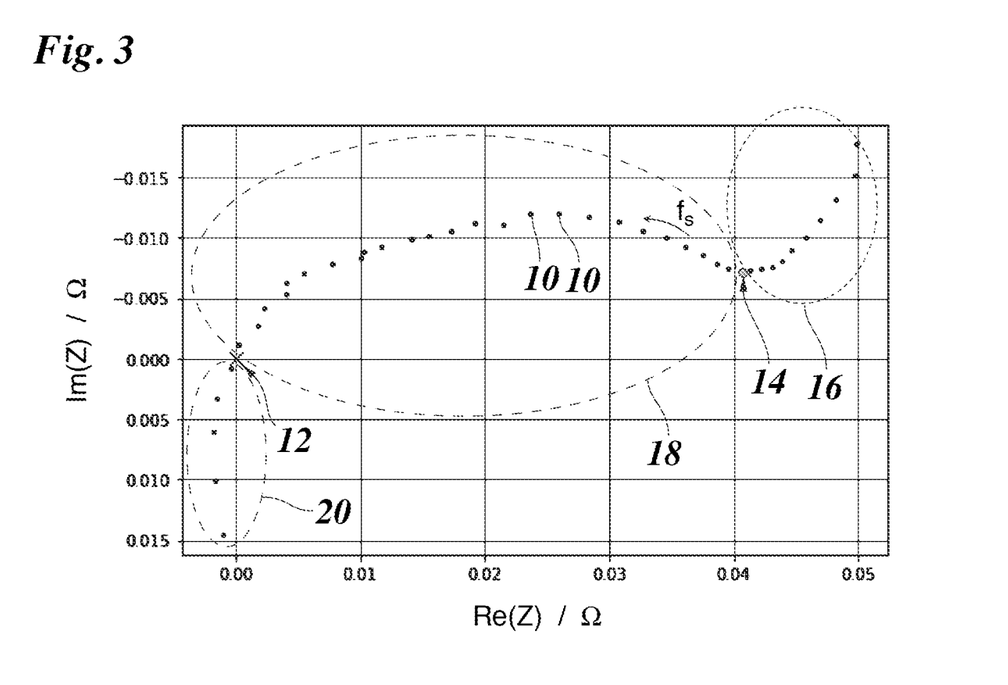
FIG. 3 is a schematic graph of a translated series of electrical impedance measurements.

This will become further comprehensible from FIG. 3 and the corresponding description.

For example, the step of identifying may comprise determining a transition between one subseries of the series of electrical impedance measurements and a further subseries of the series of electrical impedance measurements, wherein the one subseries of electrical impedance measurements has imaginary parts of electrical impedance that are negative and that have a magnitude which decreases towards the transition, and wherein the further subseries of electrical impedance has imaginary parts of electrical impedance that are negative and that have a magnitude which increases and then decreases towards the transition; wherein decreasing and increasing refers to increasing or decreasing over the course of the index of the elements of the series.

For example, the first subseries may be identified based on a decreasing magnitude of a negative imaginary part of electrical impedance and a decreasing magnitude of a positive real part of electrical impedance, for increasing measurement frequencies, towards a transition between the first subseries and the second subseries.

For example, the second subseries may be identified based on a curve progression of the magnitude of the negative imaginary part of electrical impedance over the course of increasing measurement frequencies (or over the course of decreasing real part) that forms at least one round peak or arc, while the real part is positive and decreases with increasing measurement frequencies.

Thus, the first subseries and the second subseries may be identified based on the curve shape of the series of electrical impedance measurements in the complex plane.

For example, the first subseries may be identified based on a curve progression in the complex plane of the electrical impedance showing a correlation between the magnitude of the negative imaginary part of electrical impedance and the magnitude of the positive real part of electrical impedance, the magnitudes declining towards a transition to the second subseries. And, for example, as the separation of the third subseries from the second subseries can be easily identified based on the zero-crossing in the complex plane of the imaginary part of electrical impedance, the second subseries may be identified based on the identified first subseries and/or the transition between the first and second subseries, and based on the identified position that corresponds to the zero-crossing in the complex plane of the imaginary part of electrical impedance. In other words, those electrical impedance measurements in the series of electrical impedance measurements that are arranged between the transition and the zero-crossing of the imaginary part are determined to be the second subseries of the three subseries.

For example, the identifying step may comprise: identifying a transition in the form of a local minimum of the absolute value of the negative imaginary part in the curve progression in the complex plane of the series of measurements relatively lower measurement frequencies; identifying a zero-crossing of the imaginary part of the electrical impedance at relatively higher measurement frequencies; and identifying the first, second, and third subseries based on the transition and the zero-crossing.

For example, the imaginary parts of electrical impedance of the first and second subseries may be negative.

In one or more embodiments, the step of identifying comprises determining a transition between one subseries of the series of electrical impedance measurements and a further subseries of the series of electrical impedance measurements, wherein the one subseries of electrical impedance measurements has imaginary parts of electrical impedance that are negative and that have a magnitude which basically (that is, at least for the most part of the subseries) increases towards the transition, and wherein the further subseries of electrical impedance has imaginary parts of electrical impedance that are negative and that have a magnitude which basically increases and then basically decreases (that is, at least for the most part of the subseries, first increases and then decreases) towards the transition.

In one or more embodiments, the first subseries and the second subseries are identified based on the determined local relative maximum of the imaginary part of the series of electrical impedance measurements, or based on the determined transition between the one subseries of the series of electrical impedance measurements and the further subseries of the series of electrical impedance measurements.

In at least one embodiment, the method comprises: measuring the electrical impedance of the electrochemical battery at different measurement frequencies to provide the series of electrical impedance measurements, using electrical impedance measuring means.

For example, the series of electrical impedance measurements may be provided based on the measured electrical impedance at the different measurement frequencies.

The electrical impedance measurements may be measured in any order and/or concurrently for the respective measurement frequencies.

For example, the electrical impedance measuring means may be configured to input a signal including a respective frequency to the electrochemical battery, and determine a ratio of amplitude and phase of a response signal of the same frequency to the amplitude and phase of the input signal, the frequency of the signal and of the response signal corresponding to the measurement frequency.

For example, the electrical impedance measuring means may be electrical impedance spectroscopy measuring means configured for measuring electrical impedance of an electrochemical battery at a series of measurement frequencies. That is, the electrical impedance of the electrochemical battery is measured according to a process of electrochemical impedance spectroscopy.

Using electrochemical impedance spectroscopy, electrochemical processes in the electrochemical battery are characterized by electrical measurements that characterize the AC response of the electrochemical battery to an applied AC signal. The chemical processes in the battery, in addition to the structural configuration and the configuration of the connectors, lead to characteristic frequency dependencies of the measured impedance.

During the measurement of an electrical impedance at a specific measurement frequency, a DC offset signal (an offset voltage or an offset current) or DC bias signal may be applied to the battery, which is modulated by the AC signal of the measurement frequency.

For example, the series of electrical impedance measurements may be received from an independent measuring circuit or electrical impedance measuring means. However, a battery state estimating system for estimating a battery state of an electrochemical battery may as well include electrical impedance measuring means for measuring and providing the series of electrical impedance measurements from an electrochemical battery.

For example, the electrochemical battery may be a lithium-ion battery or a lead-acid battery.

According to an aspect of the invention, there may be provided a computer-implemented method of monitoring a battery state of an electrochemical battery. The monitoring method may include the steps of the method of estimating a battery state.

For example, the method may be implemented in a battery monitoring system for monitoring a battery state of an electrochemical battery.

For example, the method may be implemented in a battery charging system for recharging a rechargeable electrochemical battery.

According to an aspect of the invention, there is provided a battery state estimating system for estimating a battery state of an electrochemical battery, the system comprising means for carrying out the steps of the method.

For example, the system may be or may be comprised in a system for monitoring a battery state of an electrochemical battery.

For example, the system may be or may be comprised in a battery charging system for recharging a rechargeable electrochemical battery.

In one or more embodiments, the battery state estimating system further comprises electrical impedance measuring means configured for measuring the electrical impedance of an electrochemical battery at different measurement frequencies to provide the series of electrical impedance measurements.

BRIEF DESCRIPTION OF THE DRAWINGS

Preferred embodiments of the invention will now be described in conjunction with the drawings, in which.

DETAILED DESCRIPTION

Figure 1:
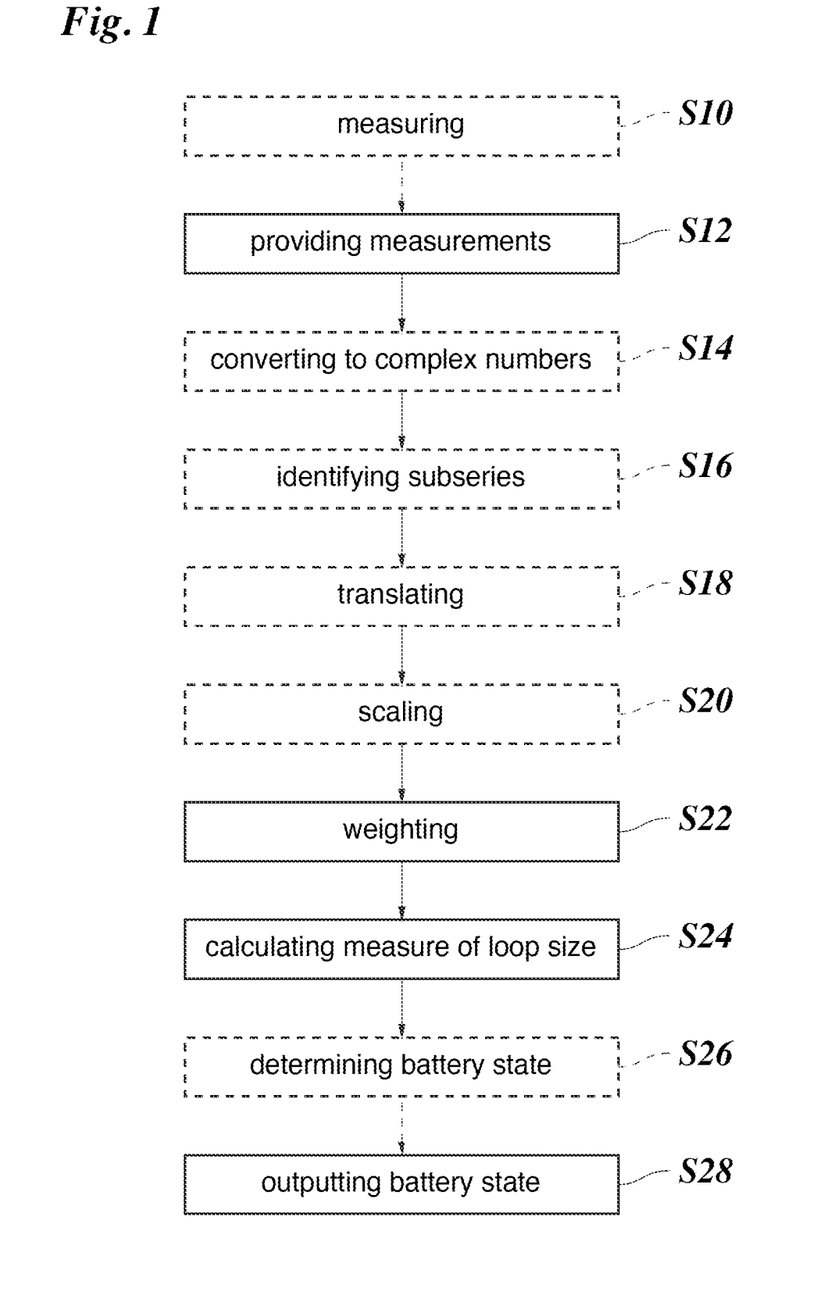
FIG. 1 is a schematic illustration of a method of estimating a battery state of a rechargeable electrochemical battery.

FIG. 1 schematically shows a computer-implemented method of estimating a battery state of a rechargeable electrochemical battery, for example, a lithium-ion battery. For example, the method may be performed by a battery state estimating system as described further below with respect to FIG. 7.

Step S10 is a step of measuring the electrical impedance of the electrochemical battery at different measurements frequencies, using electrical impedance measuring means.

From measuring the electrical impedance, in step S12, a series of electrical impedance measurements of the electrochemical battery is provided in form of a digital signal, for example, as a data set. The series is ordered according to the respective measurement frequencies, preferably in the order of increasing measurement frequencies.

However, the method may also start with step S12 of providing the measurements, which may have been measured independently from the method, and may have been communicated to a computer performing the method.

In case the provided electrical impedance measurements are not yet in the form of complex numbers (representing complex impedance), the method may include an optional step S14 of converting the provided electrical impedance measurements to complex numbers.

Optionally, the method includes steps S16, S18, and S20.

Step S16 is a step of identifying three subseries within the provided series of electrical impedance measurements, and step S18 is a step of translating the electrical impedance measurements of the series by subtracting an ohmic AC resistance value $R_0$ from the real part of the electrical impedance.

Figure 2:
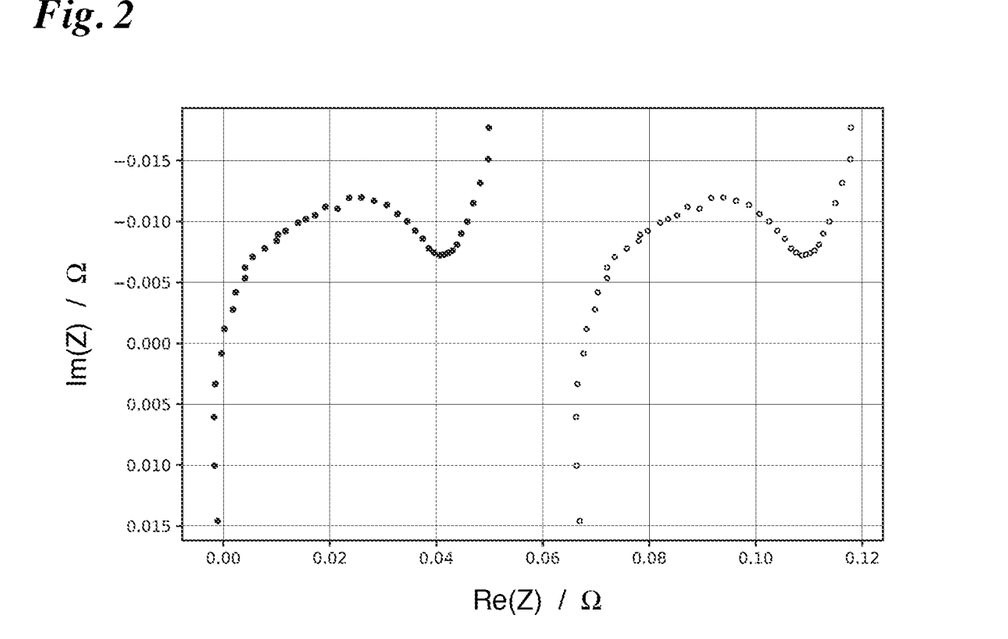
FIG. 2 is a schematic illustration of translating a series of electrical impedance measurements of a rechargeable electrochemical battery measured at respective measurement frequencies.

FIG. 2 exemplarily shows with open circles a series of electrical impedance measurements 10 measured at respective measurement frequencies $f_s$, and shows, with filled circles, the same series after subtracting the ohmic AC resistance value $R_0$ from the real part of the electrical impedance. FIG. 3 shows in detail a series of electrical impedance measurements 10 measured at respective measurement frequencies $f_s$, after subtracting the ohmic AC resistance value $R_0$ from the real part of the electrical impedance. FIGS. 2 and 3 are Nyquist diagrams in the form of a two-dimensional graph of the imaginary part Im(Z) and the real part Re(Z) of electrical impedance Z. According to convention, the imaginary part is displayed in an inversed direction, with the imaginary part increasing towards the bottom of FIGS. 2 and 3.

At relatively high measurement frequencies $f_s$, there is identified a zero-crossing 12 of the imaginary part Im(Z) of the electrical impedance. The zero-crossing 12 may correspond to an element 10 of the series of measurements. However, preferably, the zero-crossing 12 is determined by interpolating the measurements. The ohmic AC resistance value $R_0$ is determined according to the real part of the electrical impedance at the (interpolated) zero-crossing 12. In FIG. 3, due to the translating, the zero-crossing 12 is now at the position (0, 0) in the complex plane.

From the curve progression in the complex plane of the translated series of measurements, there is identified a transition 14 in the form of a local minimum of the absolute value of the (negative) imaginary part Im(Z) at relatively low measurement frequencies $f_s$. The transition 14 may correspond to an element of the series of measurements, or may be determined by interpolating the measurements.

As schematically shown in FIG. 3, the transition 14 is a transition between a first subseries 16 of the series of measurements at relatively low frequencies and a second subseries 18 of the series of measurements at intermediate frequencies. The zero-crossing 12 separates the second subseries 18 from a third subseries 20 of measurements having a positive imaginary part of electrical impedance Im(Z), at relatively high frequencies.

Preferably, the measurements are taken at logarithmically progressing measurement frequencies. Preferably, the series of measurements comprises at least 4 (four) measurements per decade of the measurement frequency range. In FIG. 3, the electrical impedance measurements 10 of the series of electrical impedance measurements are schematically indicated for illustration purposes, only. The number of measurements illustrated in FIG. 3 may deviate from the number of measurements that are actually used, and is for illustration purposes, only.

In FIG. 3, an arrow $f_s$ shows the order of the measurements 10 with increasing measurements frequency $f_s$. The first subseries 16, which has been determined based on the identified transition 14, is identified as a subseries being associated with a battery behavior of the electrochemical battery in which the electrical impedance is dominated by diffusion processes, for example, charge carrier movements of lithium ions. Such diffusion processes dominate the AC (alternating current) behavior of the battery at lower frequencies and may result in a roughly linear correlation of the absolute value of the negative imaginary part of the impedance with the absolute value of the positive real part of the impedance in range, for example, from a lowermost frequency of the measurement frequencies to a measurement frequency close to the transition 14.

The second subseries 18, which has been determined as including those measurements between the transition 14 and the zero-crossing 12, is identified as a subseries of the series of electrical impedance measurements which subseries is associated with a battery behavior of the electrochemical battery in which the electrical impedance is dominated by charge transfer processes at the electrodes of the battery. These may be, for example, transitions of electrons from the electrodes to the lithium ions, which then diffuse towards the other electrode. In the complex plane, charge transfer processes at the anode and at the cathode may each corresponds to a round peak or arc of the absolute value of the negative impedance over the course of the real part Re(Z) of the impedance Z over the imaginary part Im(Z). In the example of FIG. 3, the two round peaks or arcs are merged to a single round peak or arc in the range between the transition 14 and the zero-crossing 12.

The third subseries 20, which is determined based on the zero-crossing 12 separating the third subseries 20 from the second subseries 18, is identified as a third subseries of the series of electrical impedance measurements, based on the zero-crossing 12.

Returning to FIG. 1, in the step S20 of scaling, the translated electrical impedance measurements are scaled. In particular, the real part and the imaginary part of the electrical impedance are scaled by respective scaling factors, the absolute values of which correspond to the absolute values of the real part and the imaginary part, respectively, of the (interpolated) electrical impedance at the transition 14. Thus, the translated electrical impedance measurements are scaled to the absolute values of the imaginary part and the real part at the transition 14.

Figure 4:
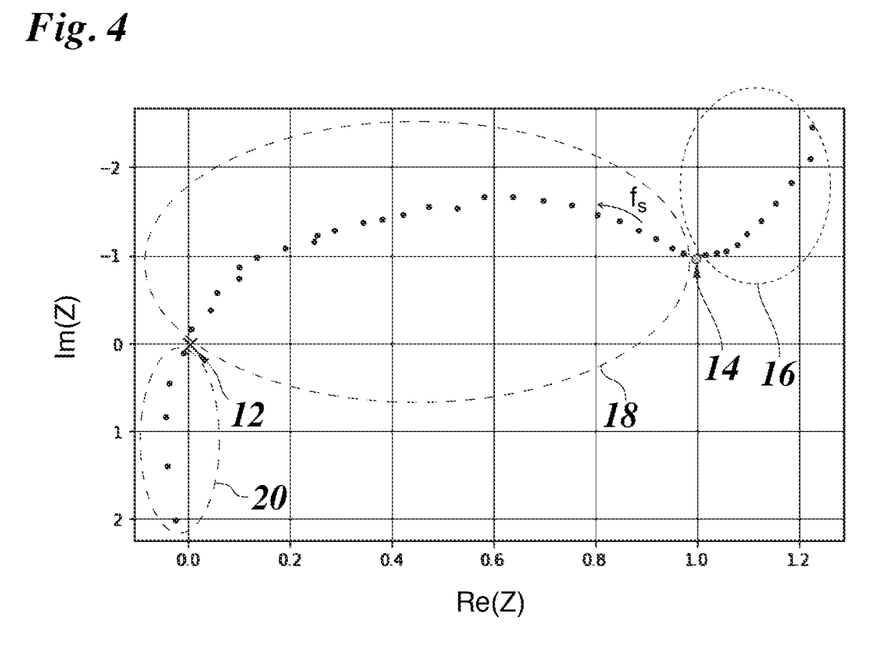
FIG. 4 is a schematic illustration showing a graph of a translated and scaled series of electrical impedance measurements.

FIG. 4 schematically shows the translated and scaled series of electrical impedance measurements 10, after the steps S18, S20 of translating and scaling have been performed. As shown in FIG. 4, the transition 14 separating the first subseries 16 from the second subseries 18 of the transformed series of electrical impedance measurements 10 is now at the position of Re(Z)=1.0, Im(Z)=−1.0.

Furthermore, the zero-crossing 12 separating the second subseries 18 from the third subseries 20 of the transformed series of electrical impedance measurements 10 is now at the position Re(Z)=0.0, Im(Z)=0.0.

Returning to FIG. 1, step S22 is a step of weighting the impedance measurements according to a weighting function. For example, the weighting function may be the logarithm to the base 10 of the measurement frequency.

Figure 5:
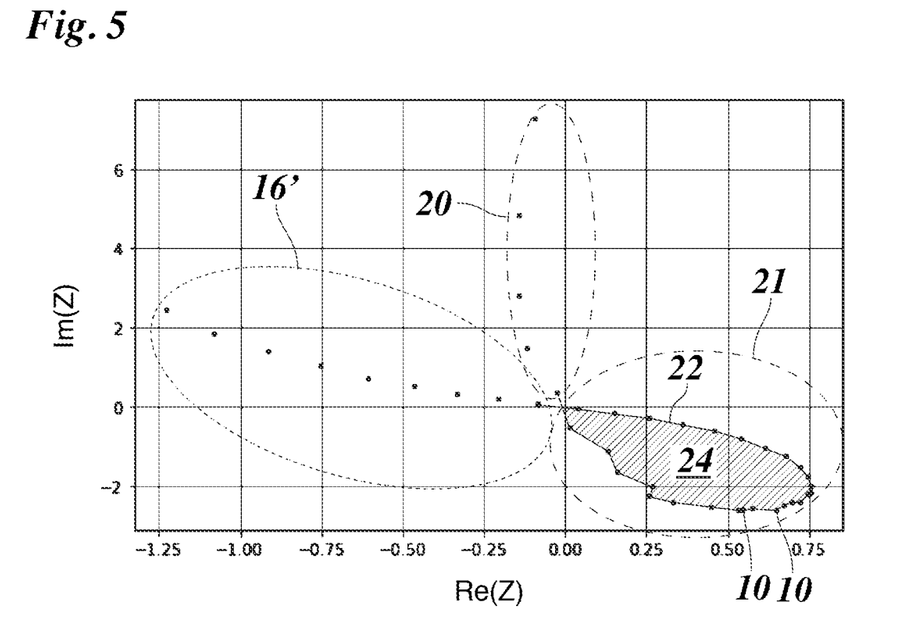
FIG. 5 is a schematic illustration showing a graph of a weighted series of electrical impedance measurements.

FIG. 5 shows the resulting series of weighted electrical impedance measurements 10. As shown, a series 21 of consecutive measurements 10 that includes at least a part of the second subseries 18, when point-to-point connected in the complex plane of the electrical impedance in a sequence according to the index s of the series of measurements, forms a closed loop 22 in the complex plane. The closed loop 22 may also include a part of the first subseries 16. The third subseries 20 does not form a part of the closed loop 22. At least a part 16' of the first subseries 16 is not part of the closed loop 22.

The series 21 forming the loop 22 includes those measurements, for which the product of the weighting function of the measurement frequency and of the real part of the transformed electrical impedance measurements is greater or equal zero. In particular, the series 21 forming the loop 22 includes those measurements of the first and second subseries 16, 18, the measurement frequencies of which are higher than the frequency at which the weighing function assumes zero. Thus, measurements of the second subseries 18, and, possibly, also measurements of the first subseries 16 insofar as these correspond to measurement frequencies higher than 1 Hz (the frequency at which the weighing function assumes zero), form the closed loop 22. Of these measurements, due to the weighting of the real parts and the imaginary parts, a range of lower measurement frequencies have been shifted towards smaller absolute values of the real part, that is, towards the left in the graph of the complex plane.

Returning to FIG. 1, step S24 is a step of calculating a measure of the size of the loop in the complex plane, wherein the square root of the area 24 (FIG. 5) that is enclosed by the loop 22 is calculated as the measure of the size of the loop.

Step S26 is a step of determining an estimation of a state of health (SoH) of the electrochemical battery based on the calculated square root of the area 24. For determining the estimation of the state of health from the square root of the area 24, a look-up table and, optionally, interpolation, is used.

For example, different look-up tables may be used depending on a measured overall battery voltage (DC voltage) that has been measured independently.

The respective look-up-table represents a correlation between the calculated measure of the size of the loop (that is, the square root of the area 24) and the state of health of the battery.

Figure 6:
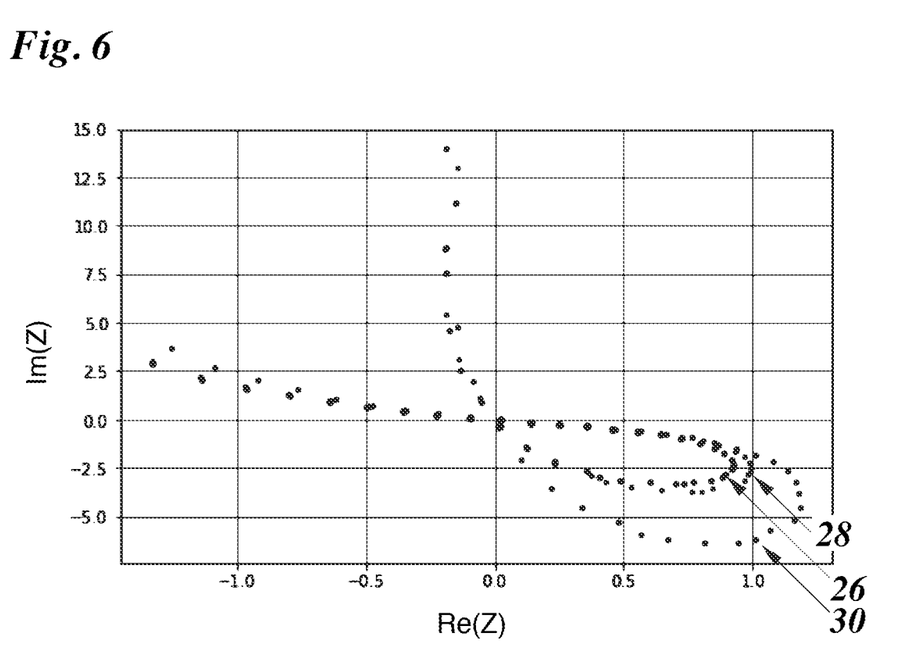
FIG. 6 is a schematic illustration showing a graph of weighted series of electrical impedance measurements of three batteries having different states of health.

FIG. 6 exemplarily shows results of weighting respective translated and scaled impedance measurements of three different batteries having different states of health, which have been provided according to the above described method of FIG. 1. A first battery having a state of health (SoH) of 83.6% corresponds to a loop of measurements 26. A second battery having a state of health (SoH) of 87.0% corresponds to a loop of measurements 28. A third battery having a state of health (SoH) of 93.8% corresponds to a loop of measurements 30. As shown, the area enclosed by the loop correlates with the state of health.

A variation of the area of the closed loop emphasizes differences in variations between measurements close to the transition 14 and measurements in a higher frequency range (that is, higher with respect to those close to the transition 14) of the second subseries 18.

It has been found that the measure of the area 24 enclosed by the closed loop 22 in the complex plane forms a practical and useful representation of the state of health of a rechargeable electrochemical battery.

Figure 7:
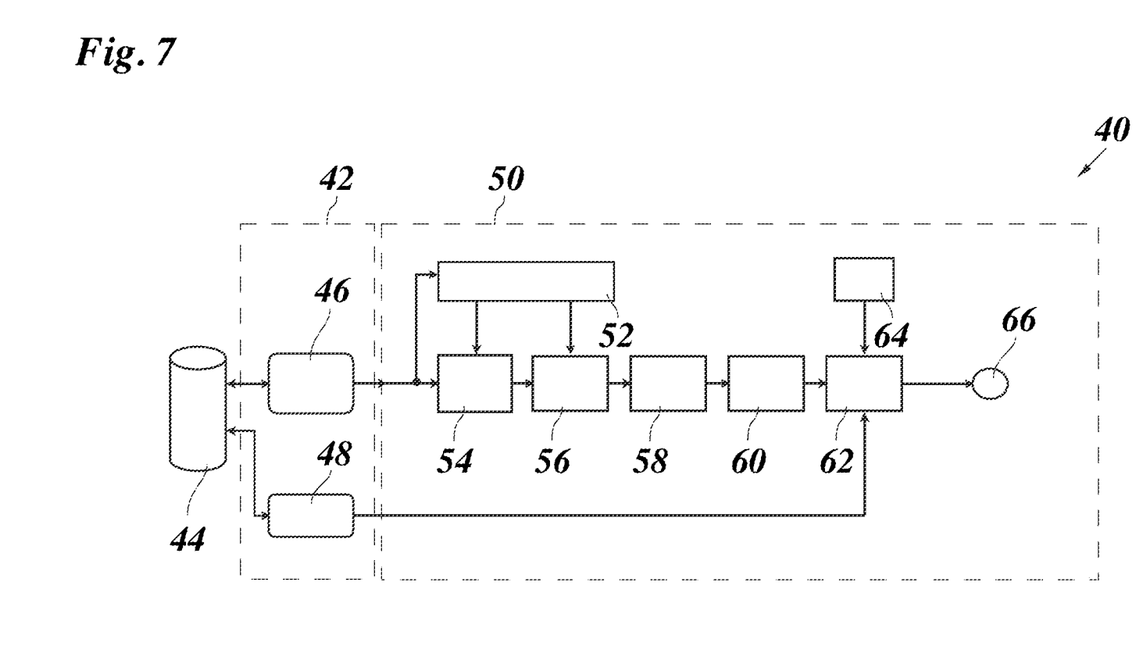
FIG. 7 is a schematic illustration of a system for estimating a battery state of a rechargeable electrochemical battery.

FIG. 7 schematically shows an example of a battery state estimating system 40 configured for performing the method of FIG. 1, the system optionally including electrical impedance measuring means 42. For example, the battery state estimating system 40 may be implemented in a computer, such as a microcontroller. For example, the microcontroller including the system 40 and, optionally, the electrical impedance measuring means 42 may be part of a battery monitoring system for monitoring a battery state of an electrochemical battery 44. For example, the system 40 may be part of a battery charging system configured for recharging a rechargeable electrochemical battery 44.

The electrical impedance measuring means 42 includes an electrical impedance measuring unit 46 and a voltage measuring unit 48.

The battery state estimating system 40 further includes computational means 50.

For a series of measurement frequencies $f_s$, the electrical impedance measuring unit 46 applies an excitation signal, for example a sinusoidal signal, to an electrochemical battery 44 that is to be measured. The signal is input in the form of a small amplitude alternating current (AC) signal, and the alternating current response from the battery 44 is measured. For example, a current signal is input, and a voltage response signal is measured. Alternatively, a voltage signal is input, and a current response signal is measured. During the measurements, a direct current (DC) bias voltage or DC bias current may be applied in accordance with the type of the electrochemical battery 44. The measuring setup corresponds to electrochemical impedance spectroscopy (EIS) measurement setups known as such. The measurement frequencies are arranged or increased in equidistant steps on a logarithmic scale, for the respective measurements, in accordance with a measurement setup that is predetermined for the type of the rechargeable electrochemical battery 44, for example, according to a battery ID read out from the battery 44. For example, the battery type may be read out by the battery charging system from the battery 44 in the form of an identification number (ID) that is associated with charging parameters for the battery 44.

The measured electrical impedance at a specific measurement frequency is the ratio of the amplitude and phase of the AC response signal to the amplitude and phase of the input signal and is represented as a complex number (complex impedance). For example, four different measurements frequencies may be used per decade of the measurement frequencies.

In addition, the voltage unit 48 measures the overall battery voltage of the battery 44 before and after the electrical impedance measurements. In particular, the overall battery voltage may be a respective DC voltage.

The computational means 50 include identifying means 52 for identifying the first subseries 16, second subseries 18 and third subseries 20 in accordance with step S16 of FIG. 1 and providing identification information identifying the subseries 16, 18, 20 and/or the transition 14 and zero-crossing 12 to translating means 54 and scaling means 56.

The translating means 54 and scaling means 56 translate and scale the series of electrical impedance measurements 10 received from the measuring means 42, for example, in accordance with steps S18 and S20 of FIG. 1.

Furthermore, the computational means 50 include weighting means 58 for weighting the impedance measurements received from the scaling means 56 in accordance with a weighting function, for example, in accordance with step S22 of FIG. 1.

Furthermore, the computational means 50 include calculating means 60 for calculating a measure of a loop size of a closed loop formed by the weighted series of measurements when connected point-to-point, for example, in accordance with step S24 of FIG. 1.

Furthermore, the computational means 50 include battery state determining means 62 for determining a battery state 66 based on the calculated measure of the loop size, the overall battery voltage received from the voltage unit 48, and using a look-up table 64 associated with the value of the overall battery voltage. For example, the battery state 66 in the form of a state of health (SoH) is determined in accordance with step S26 of FIG. 1 and is output. That is, different look-up-tables are provided for different values of the overall battery voltage, representing a plurality of characteristics of the battery state depending on the overall battery voltage. Different look-up tables may be provided in the form of a multi-dimensional look-up table.

In the above examples, an area of the loop is implemented as a measure of the size of the loop. However, other measures of the size may be implemented, such as a width, a length, or other extension.

In the above examples, the weighting function generates a single loop in the complex plane. However, in other embodiments, other weighting functions may be used that generate two or more loops in the complex plane. In this case, for example, estimations of different battery states may be determined based on respective calculated measures of the size of respective loops. For example, based on the estimations of different battery states, a further battery state may be determined and output as an estimation of the further battery state. That is, different estimated battery parameters (the different battery states) may be combined for determining the further battery state.

Thus, the estimation of the further battery state may be determined based on one or more calculated measures of the size of respective loops in the complex plane.

What is claimed is:

1. A computer-implemented method of estimating a battery state of an electrochemical battery, the method comprising:
   providing a series of electrical impedance measurements of an electrochemical battery, each electrical impedance measurement being measured at a respective measurement frequency, the series being ordered according to the respective measurement frequencies,
   optionally, translating and/or scaling, in the complex plane of the electrical impedance, the series of electrical impedance measurements,
   weighting the electrical impedance measurements according to a weighting function that is dependent on the index of the series or on the measurement frequency, resulting in at least a series of consecutive elements of the series of measurements, when point-to-point connected in the complex plane of the electrical impedance in a sequence according to the index of the series of measurements, forming at least one loop in the complex plane,
   calculating a measure of the size of the at least one loop in the complex plane,
   determining an estimation of a battery state of the electrochemical battery based on the calculated measure of the size of the at least one loop in the complex plane, and
   outputting the estimation of the battery state.

2. The method of claim 1, wherein values output by the weighting function increase with increasing measurement frequencies.

3. The method of claim 1, wherein the weighting function corresponds to a logarithm of the measurement frequency.

4. The method of claim 1, wherein calculating a measure of the size of the at least one loop in the complex plane comprises calculating an area that is enclosed by the at least one loop in the complex plane.

5. The method of claim 4, wherein calculating a measure of the size of the at least one loop in the complex plane comprises calculating a square root of an area that is enclosed by the at least one loop in the complex plane.

6. The method of claim 1, wherein an estimation of a state of health of the electrochemical battery is determined based on the calculated measure of the size of the at least one loop in the complex plane.

7. The method of claim 1, wherein the method comprises:
   identifying at least three subseries within the provided series of electrical impedance measurements, a first subseries of the three subseries being associated with a battery behavior of the electrochemical battery in which the electrical impedance is dominated by diffusion processes, a second subseries of the three subseries being associated with a battery behavior of the electrochemical battery in which the electrical impedance is dominated by charge transfer processes at the electrodes of the battery, a third subseries of the three subseries being separated from the second subseries at a position that corresponds to a zero-crossing in the complex plane of the imaginary part of electrical impedance, and translating the respective electrical impedance measurements corresponding to subtracting an ohmic alternating current resistance value from the real part of electrical impedance, wherein the ohmic alternating current resistance value is determined according to a real part of electrical impedance at the zero-crossing in the complex plane of the imaginary part of electrical impedance which zero-crossing in the complex plane corresponds to the position at which the third subseries of the three subseries is separated from the second subseries; and scaling the respective translated electrical impedance measurements, corresponding to scaling the real part and the imaginary part of electrical impedance by respective scaling factors, the absolute values of which are determined based on the absolute values of the real part and the imaginary part, respectively, of an electrical impedance that corresponds to a transition between the translated first subseries of the series of electrical impedance measurements and the translated second subseries of the series of electrical impedance measurements.

8. The method of claim 7, wherein the step of identifying comprises determining a local relative maximum of the imaginary part of the series of electrical impedance measurements, the local relative maximum being separated by other elements of the series of electrical impedance measurements from the zero-crossing in the complex plane of the imaginary part of electrical impedance of the series of electrical impedance measurements, wherein optionally the local relative maximum is a local relative maximum when smoothing and/or interpolating the series of electrical impedance measurements.

9. The method of claim 7, wherein the step of identifying comprises determining a transition between one subseries of the series of electrical impedance measurements and a further subseries of the series of electrical impedance measurements, wherein the one subseries of electrical impedance measurements has imaginary parts of electrical impedance that are negative and that have a magnitude which basically increases towards the transition, and wherein the further subseries of electrical impedance has imaginary parts of electrical impedance that are negative and that have a magnitude which basically increases and then basically decreases towards the transition.

10. The method of claim 7, wherein the first subseries and the second subseries are identified based on the determined local relative maximum of the imaginary part of the series of electrical impedance measurements, or based on the determined transition between the one subseries of the series of electrical impedance measurements and the further subseries of the series of electrical impedance measurements.

11. The method of claim 1, wherein the method further comprises:

measuring the electrical impedance of an electrochemical battery at different measurement frequencies to provide the series of electrical impedance measurements.

12. A battery state estimating system for estimating a battery state of an electrochemical battery, the system comprising means for carrying out the steps of the method of claim 1.

13. The battery state estimating system of claim 12, the battery state estimating system further comprising:

electrical impedance measuring means configured for measuring the electrical impedance of an electrochemical battery at different measurement frequencies to provide the series of electrical impedance measurements.

* * * * *